United States Patent
Matsumoto et al.

(10) Patent No.: US 8,122,324 B2
(45) Date of Patent: Feb. 21, 2012

(54) ERROR CORRECTION CODING APPARATUS

(75) Inventors: Wataru Matsumoto, Tokyo (JP); Rui Sakai, Tokyo (JP); Hideo Yoshida, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1172 days.

(21) Appl. No.: 11/886,995

(22) PCT Filed: Mar. 30, 2006

(86) PCT No.: PCT/JP2006/306696
§ 371 (c)(1),
(2), (4) Date: Sep. 24, 2007

(87) PCT Pub. No.: WO2006/106841
PCT Pub. Date: Oct. 12, 2006

(65) Prior Publication Data
US 2009/0031186 A1     Jan. 29, 2009

(30) Foreign Application Priority Data
Mar. 31, 2005   (JP) .................. P2005-101134

(51) Int. Cl.
*H03M 13/00* (2006.01)
(52) U.S. Cl. .................. 714/774; 714/758
(58) Field of Classification Search .......... 714/758, 714/774
See application file for complete search history.

(56) References Cited

U.S. PATENT DOCUMENTS

| | | | |
|---|---|---|---|
| 6,633,856 B2 * | 10/2003 | Richardson et al. | 706/15 |
| 6,789,227 B2 * | 9/2004 | De Souza et al. | 714/804 |
| 6,895,547 B2 * | 5/2005 | Eleftheriou et al. | 714/801 |
| 7,178,082 B2 * | 2/2007 | Yu et al. | 714/752 |
| 7,395,484 B2 | 7/2008 | Matsumoto | |
| 2004/0034828 A1 * | 2/2004 | Hocevar | 714/800 |
| 2004/0057575 A1 | 3/2004 | Zhang et al. | |
| 2004/0199859 A1 * | 10/2004 | Matsumoto | 714/801 |
| 2005/0160351 A1 * | 7/2005 | Ko et al. | 714/801 |

FOREIGN PATENT DOCUMENTS

| | | |
|---|---|---|
| EP | 1 241 795 A2 | 9/2002 |
| JP | 2004-15551 A | 1/2004 |
| JP | 2005-45735 A | 2/2005 |
| WO | WO 2004/006444 A1 | 1/2004 |

OTHER PUBLICATIONS

Luby et al., "Efficient Erasure Correcting Codes," IEEE Transactions on Information Theory, vol. 47, No. 2, pp. 569-584, (2001), XP011027874. Johnson et al., "A Family of Irregular LDPC Codes With Low Encoding Complexity," IEEE Communications Letters, vol. 7, No. 2, pp. 79-81, (2003), XP011066488.
Michael Luby, LT Codes, Proceedings of the 43rd Annual IEEE Symposium on Foundations of Computer Science (FOCS'02), Nov. 2002, pp. 271-280.
Amin Shokrollahi, Raptor Codes, Proceedings of International Symposium on Information Theory (ISIT 2004), Aug. 2004, pp. 36.

* cited by examiner

*Primary Examiner* — M. Mujtaba K Chaudry
(74) *Attorney, Agent, or Firm* — Birch, Stewart, Kolasch & Birch, LLP (57) ABSTRACT

An error correction coding apparatus is disposed to generate a low-density parity-check code 16 from an input information sequence 15 by using a low-density parity-check matrix which satisfies a predetermined weight distribution, and includes a low-density parity-check matrix output means 13 for forming the above-mentioned low-density parity-check matrix by continuously arranging a number of rows in each of which the same number of cyclic-permutation matrices as the row weight are arranged, the number of rows satisfying the above-mentioned predetermined weight distribution, and then gradually increasing or decreasing the row weight, and for outputting the above-mentioned low-density parity-check matrix.

4 Claims, 4 Drawing Sheets

ERROR CORRECTION CODING APPARATUS

FIELD OF THE INVENTION

The present invention relates to an error correction coding apparatus. More particularly, it relates to a technology for forming a deterministic systematic low-density parity-check code using a pseudo circulant matrix.

BACKGROUND OF THE INVENTION

An LT (Luby Transfer) code is representative of prior art disappearance correction codes. Features of this code are that it assumes a communication path as a disappearance communication path, a transmitter side can arbitrarily code a packet having an information length k so that the packet has a code length n which falls within the limit n>k, and a receive side can succeed in decoding the information packet k only by successfully receiving at most (n+$\epsilon$) ($\epsilon \approx 1.05$ to $1.2 \times n$) packets (for example, see nonpatent reference 1).
[Nonpatent reference 1] Michael Luby, "LT codes", in Proceedings of ACM Symposium on FOCS, 2002.

A problem with LT codes is, however, that because a random number sequence is used in order to form an LT code, good performance is not achieved particularly for a short-length LT code. The present invention is provided in order to solve this problem, and it is therefore an object of the present invention to form a deterministic systematic LDPC code using a pseudo circulant matrix other than a random number sequence.

DESCRIPTION OF THE INVENTION

In accordance with the present invention, there is provided an error correction coding apparatus which generates a low-density parity-check code from an input information sequence by using a low-density parity-check matrix which satisfies a predetermined weight distribution, characterized in that the error correction coding apparatus includes: a low-density parity-check matrix output means for forming the above-mentioned low-density parity-check matrix by continuously arranging a number of rows in each of which the same number of cyclic-permutation matrices as the row weight are arranged, the number of rows satisfying the above-mentioned predetermined weight distribution, and then gradually increasing or decreasing the row weight, and for outputting the above-mentioned low-density parity-check matrix.

Because the error correction coding apparatus in accordance with the present invention forms a deterministic systematic low-density parity-check code using a pseudo circulant matrix, it can make a disappearance correction with a high degree of efficiency even if the low-density parity-check code has a short code length.

BEST MODE OF CARRYING OUT THE INVENTION

Hereafter, in order to explain this invention in greater detail, the best mode of carrying out the invention will be described with reference to the accompanying drawings.

Embodiment 1

Hereafter, an error correction coding apparatus and a decoding apparatus in accordance with the present invention will be explained. In this embodiment, in order to explain concretely an error correction coding method of the present invention and a decoding method which corresponds to this encoding method, a configuration example of a system in which information is transmitted via a network is used.
[Equipment Configuration]

Figure 1:
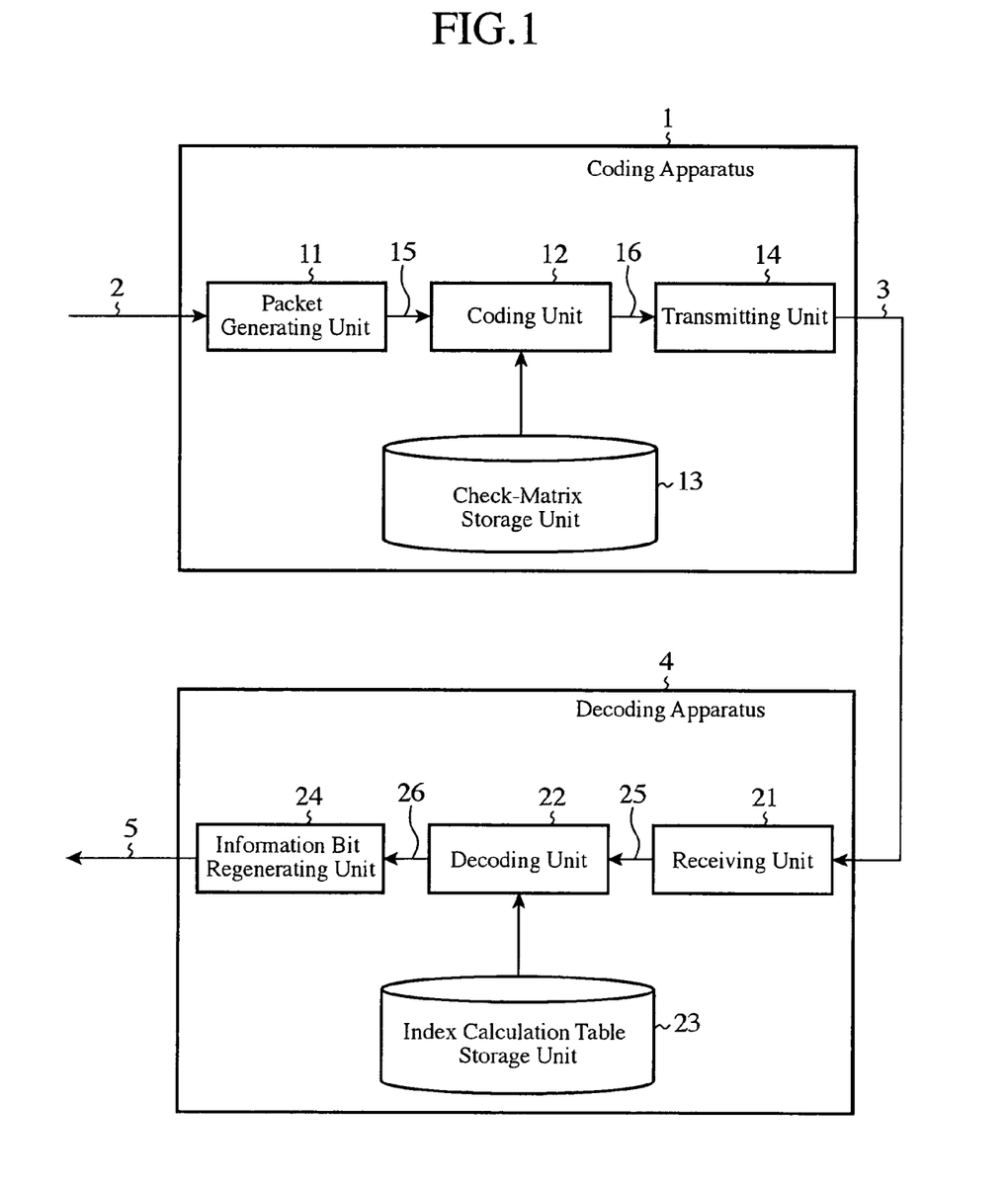
FIG. 1 is a block diagram showing the structure of a coding apparatus and a decoding apparatus in accordance with embodiment of the present invention.

FIG. 1 is a block diagram showing the structures of these coding apparatus and decoding apparatus. In the figure, the coding apparatus 1 is the error correction coding apparatus in accordance with the present invention which is arranged on a side which transmits information, and which receives an information bit 2, performs error correction coding on the information bit, and transmits a signal which it has acquired as a result of the coding to the network 3. The decoding apparatus 4 is the one which corresponds to the error correction coding method in accordance with the present invention, and which receives the information which the coding apparatus 1 has transmitted via the network 3, and decodes the information to generate an information bit 5. As long as the network 3 is a medium which transmits information, it can be either of cable type or of wireless type.

The coding apparatus 1 is provided with a packet generating unit 11, a coding unit 12, a check-matrix storage unit 13, and a transmitting unit 14. The packet generating unit 11 is a part which receives an information bit 2 from outside the apparatus, and generates an input packet sequence 15 with the location numbers of packets in units of a packet size length L (bits). In the following explanation, a total number of packets included in the packet sequence 15 is expressed as k (k is a natural number), and elements of the packet sequence 15 are expressed as IP(1), IP(2), . . . , and IP(k), respectively. An argument of each sequence is a location number.

The coding unit 12 is a part which performs low-density parity-check coding (Low Density Parity Check: LPDC coding) on the input packet sequence 14 to generate an encoded packet sequence 16. Assume that the encoded packet sequence 16 is encoded for disappearance correction, and includes a number N of packets (N is a natural number). Hereafter, the packets included in the encoded packet sequence 16 are expressed as C(1), C(2), . . . , and C(N), respectively.

The coded packet sequence 16 must be formed so that in the subsequent decoding processing by the decoding apparatus 2, it can be referred to so as to generate the original packet sequence 15. Therefore, when "the elements IP(1) to IP(K) of the input packet sequence 15 are defined as variable nodes", and "the elements C(1) to C(N) of the encoded packet sequence 16 are defined as check nodes", the coding unit 12 generates the encoded packet sequence 15 so that a bipartite graph is constructed of the variable nodes, the check nodes, and edges each of which connects a variable node with a check node. In this case, the number of edges connected to each check node is called the "weight" of each check node.

The check-matrix storage unit 13 is an example of a low-density parity-check matrix output means defined in claim 1, and is a part which stores a binary low-density parity-check matrix H (simply referred to as a check matrix H from here on) which satisfies a predetermined weight distribution D, and outputs the check matrix H to the coding unit 12. The structure of the check matrix H which the check-matrix storage unit 13 stores and a method of calculating the weight distribution D will be mentioned later.

The transmitting unit 14 is a part which, after performing modulation, etc. on the packet sequence generated by the coding unit 12, sends out this packet sequence in the form of a signal which complies with the network 3, such as a light or electric signal, or a radio signal, and has a structure depends on the network 3.

The decoding apparatus 2 is provided with a receiving unit 21, a decoding unit 22, an index calculation table storage unit 23, and an information bit regenerating unit 24. The receiving unit 21 is a part which receives a signal transmitted by the transmitting unit 13 by way of the network 3, and the signal received by the receiving unit 21 is outputted as a received packet sequence 25.

The decoding unit 22 is a part which decodes the received packet sequence 25 to generate a disappearance correction code. The decoded result of the decoding unit 22 is outputted as a decoded packet sequence 25. Because the decoding unit 22 receives only the received packet sequence 24 which the receiving unit 21 has succeeded in receiving, the packets included in the received packet sequence 24 are equivalent to some packets of the packet sequence 16 of the transmit side which lack a part of the packet sequence 16, and are, for example, C(1), C(3), C(7), . . . , and C(N). The decoding unit 22 decodes the received packet sequence 24 to generate IP(1), IP(2), . . . , and IP(K), as the decoded packet sequence 25.

The index calculation table storage unit 23 is a storage for storing an index calculation table. The index calculation table holds a relation among the row elements of the check matrix, and is used to, even in a case in which some rows of the check matrix have lacked during transmission via the network 3, enable the receive side to reconstruct the row elements which are lacking by making a combination of row elements which it has succeeded in receiving and performing a simple operation on the combination.

The information bit regenerating unit 24 is a part which receives the decoded packet sequence 25 which the decoding unit 22 outputs, and then converts it to an information bit 5 and outputs this information bit.

[Explanation of the Operation of the Coding Side]

Next, the operation of the coding apparatus 1 in accordance with embodiment of the present invention will be explained. The packet generating unit 11 acquires, as the information bit 2, an information vector $x=(x_1\ x_2\ \ldots\ x_k) \in F_2^k$, $\{0,1\} \in F_2$ from outside the apparatus. Hereinafter, for the sake of simplicity, assume that the size L of one packet is 1. As a result, the following relation: $x_1=IP(1)$, $x_2=IP(2)$, $x_3=IP(3)$, . . . , $x_K=IP(K)$ is established between IP(1), IP(2), . . . , and IP(K) of the packet sequence 15 generated by the packet generating unit 11, and the information vector x. Hereafter, the packet sequence 15 is expressed as $x_1, x_2, \ldots, x_K$.

The coding unit 12 codes the packet sequence 15 using the check matrix H stored in the check-matrix storage unit 13 to generate an encoded packet sequence 16. The check matrix H is a binary check matrix of N×K, and is a check matrix comprised of only elements of 1 and elements of 0, where N is a code length and K is an information length.

The check matrix H is so formed as to satisfy a predetermined weight distribution D (a configuration condition 1), and to have a configuration (a configuration condition 2) in which elements having a value of 1 are distributed along a direction of the columns of the check matrix H as uniformly as possible in the check matrix. The details of this method of forming the check matrix H will be explained later, and, hereafter, the coding process on the basis of an example of the check matrix H which satisfies these conditions will be explained first.

Figure 2:
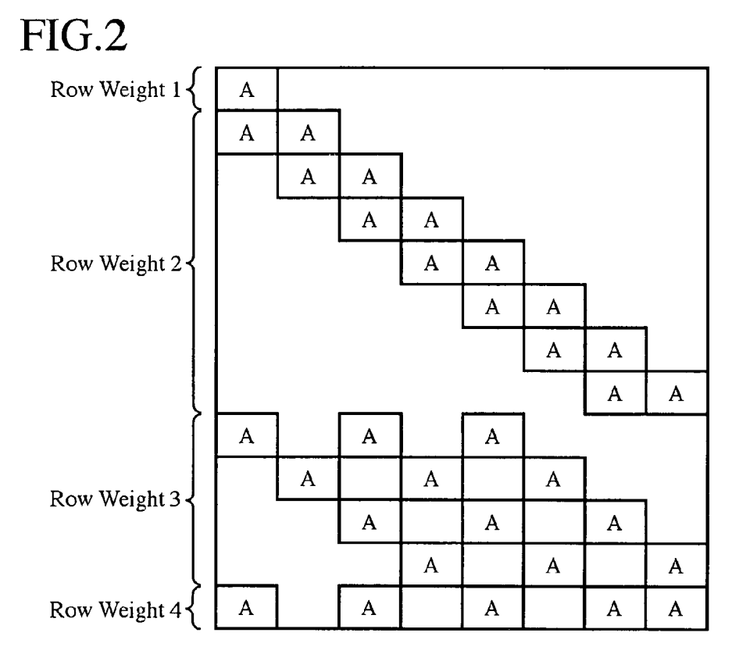
FIG. 2 is a diagram showing an example of the configuration of a low-density parity-check matrix in accordance with embodiment of the present invention.

FIG. 2 is a diagram showing a configuration example of the check matrix H. In the figure, A is a cyclic-permutation matrix (a submatrix). All elements other than A(s) are 0. The matrix A is a p×p cyclic-permutation matrix with a column weight 1 and a row weight 1. For example, in the case of p=3, the elements of A can be shown in a perfect form given by either of the following expressions (1) to (3):

[Equation 1]

$$\begin{pmatrix} 1 & 0 & 0 \\ 0 & 1 & 0 \\ 0 & 0 & 1 \end{pmatrix} \quad (1)$$

$$\begin{pmatrix} 0 & 1 & 0 \\ 0 & 0 & 1 \\ 1 & 0 & 0 \end{pmatrix} \quad (2)$$

$$\begin{pmatrix} 0 & 0 & 1 \\ 1 & 0 & 0 \\ 0 & 1 & 0 \end{pmatrix} \quad (3)$$

One of the features of the check matrix H shown in FIG. 2 is that a number of rows with a certain row weight, the number satisfying the weight distribution D, are continuously running, and plural sets of rows with gradually-increased row weights are running adjacent to those rows. That is, when the number of rows with a weight w which satisfies the weight distribution D is expressed as R(w) according to the configuration condition 1, a number of rows with an identical row weight are continuously running and plural sets of rows with larger row weights are running adjacent to those rows in such a way that the first row to the pth row are rows with a row weight 1 (w=1), the (p+1)th row to the (p+R(2))th row are rows with a row weight 2 (w=2), the (p+R(2)+1)th row to the (p+R(2)+R(3))th row are rows with a row weight 3 (w=3), and . . . .

In this embodiment, although only the configuration in which the row weight increases gradually is shown, it cannot be overemphasized that a configuration in which the row weight decreases gradually offers the same advantage.

In addition, the check matrix H shown in FIG. 2 has a feature that because A is a cyclic-permutation matrix, the next row element can be acquired by carrying out a cyclic shift of a previous row element in a range of rows with the same row weight (for example, in the case of the row weight 2, in a range of the (p+1)th row to the (p+R(2))th row).

By configuring the check matrix in this way, the check-matrix storage unit 13 has only to store the first one of each set of rows with the same row weight, and therefore can expand the other row elements on the basis of the weight distribution D at the time of coding. This results in reduction in the storage capacity.

In addition, in spite of the reduction in the storage capacity, the next row in the check matrix can be reconstructed by carrying out only an operation with a very-light calculation load, which is referred to as a cyclic-shift operation.

The configuration condition 2 is intended for preventing the occurrence of a status in which elements having a value of 1 are biased toward some columns, hence the existence of some columns without any elements of 1 in the check matrix makes the rank of the matrix become smaller than the number of elements of the information vector, and therefore the information vector cannot be decoded. The method of forming the check matrix H according to this condition will be explained below in detail.

In the subsequent explanation, in order to explain the coding process concretely, a polynomial representation of the check matrix will be introduced. When a cyclic polynomial representing the ith row of the cyclic-permutation matrix A is expressed as $I_i(x)$, it can be given by the following equation: $I_i(x)=a_0 g^0 + a_1 g^1 + \ldots + a_{p-1} g^{p-1}$, $a_i \in \{0,1\}$. For example, when the cyclic-permutation matrix A is a matrix (1) shown in Equation 1, $I_i(1)=g^{(i-1) \bmod p}$ is provided for a row number i and $1<=i<=p$. When the cyclic-permutation matrix A is a matrix (2) shown in Equation 1, $I_i(2)=g^{i \bmod p}$ is provided. When the cyclic-permutation matrix A is a matrix (3) shown in Equation 1, $I_i(3)=g^{(i+1) \bmod p}$ is provided. Thus, the element at the jth $(1<=j<=p)$ column of the cyclic-permutation matrix is expressed as a product of $g^{j-1}$ and a coefficient $a_j \in \{0,1\}$.

Each row of the check matrix H which is a matrix with N rows and K columns can be expressed by a polynomial, as in the case of the p×p cyclic-permutation matrix A. A polynomial representation of the nth row of the check matrix H is given by $y_n = b_0 g^0 + b_1 g^1 + \ldots + b_{K-1} g^{K-1}$, $b_j \in \{0,1\}$. Assume that the check-matrix storage unit 13 stores only the coefficients of a polynomial representing the first row with the weight w on the basis of the features of the check matrix H.

Figure 3:
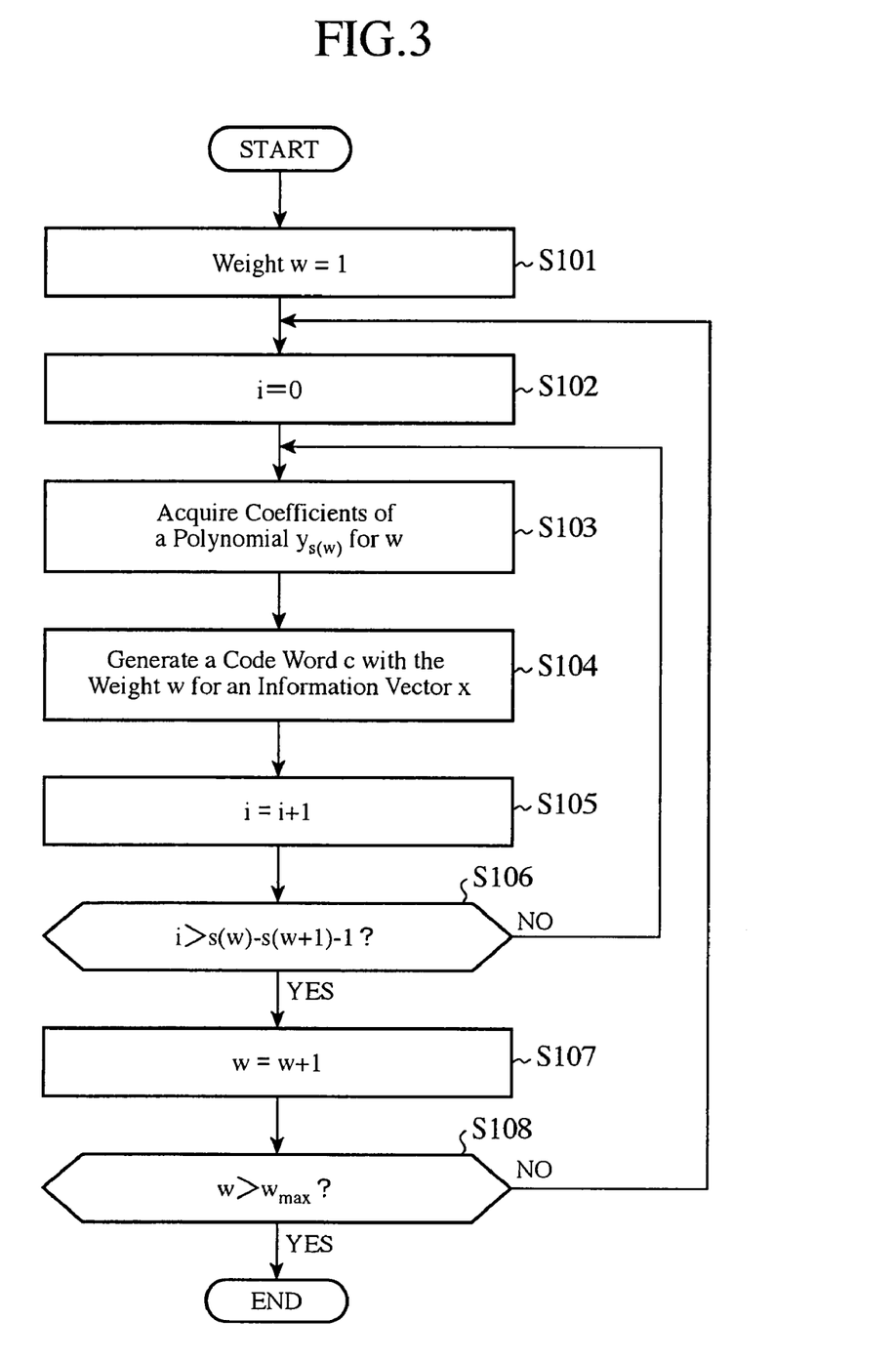
FIG. 3 is a flow chart of a process of generating a low-density parity-check code in accordance with embodiment of the present invention.

The coding unit 12 then codes the information vector on the basis of the check matrix stored in the check-matrix storage unit 13. FIG. 3 is a flow chart of the coding process performed by the coding unit 12. In advance of carrying out this process, the coding unit defines a maximum row weight as $w_{max}$ beforehand. The coding unit 12 initializes the weight w to 1 first (in step S101). Next, the coding unit initializes a counter variable i to 0 (in step S102).

After performing this initialization, the coding unit 12 acquires a coefficient vector $b_{s(w)}=(b_0^{s(w)} \, b_1^{s(w)} \ldots b_{K-1}^{s(w)})$ of a polynomial $y_{s(w)} = b_0^{s(w)} g^0 + b_1^{s(w)} g^1 + \ldots + b_{K-1}^{s(w)} g^{K-1}$, $b_j^{s(w)} \in \{0,1\}$, which corresponds to w, from the check-matrix storage unit 13 (in step S103).

The coding unit then calculates, as a code word c with the weight w for the information vector x, $c_{s(w)+i}=b_{s(w)+i} \times x^T$ (in step S104). $x^T$ shows the transposition of x. Here, a coefficient vector $b_{s(w)+i}$ is formed by cyclic-shifting the elements of the above-mentioned coefficient vector as follows:

$$b_{s(w)} = (b_0^{s(w)} \quad b_1^{s(w)} \quad \ldots \quad b_{K-1}^{s(w)})$$
$$b_{s(w)+1} = (b_{K-1}^{s(w)} \quad b_0^{s(w)} \quad \ldots \quad b_{K-2}^{s(w)})$$
$$b_{s(w)+2} = (b_{K-2}^{s(w)} \quad b_{K-1}^{s(w)} \quad \ldots \quad b_{K-3}^{s(w)})$$
$$\vdots \qquad \vdots$$

The coding unit then adds 1 to i (in step S105), and judges whether i to which 1 has been added exceeds $s(w)-s(w+1)-1$ (in step S106). As a result, when i is equal to or less than $s(w)-s(w+1)-1$ (in step S105: No), the coding unit returns to step S103.

In contrast, when i exceeds $s(w)-s(w+1)-1$ (step S105: Yes), the coding unit adds 1 to w (in step S107). After adding 1 to w, the coding unit judges whether w exceeds $w_{max}$ (in step S108), and, when w is equal to or less than $w_{max}$ (in step S108: No), the coding unit returns to step S102. In contrast, when w exceeds $w_{max}$ (in step S108: Yes), the coding unit ends the process.

The transmitting unit 14 sends out the code word vector coded by the coding unit 12 to the network 3. The operation on the coding side is thus completed.

[Explanation of the Operation on the Decoding Side]

When the receiving unit 21 of the decoding apparatus 4 receives the code word vector from the network 3, the decoding unit 22 generates the decoded packet sequence 25 by decoding the disappearance correction code of the received packet sequence 24. Assume that the receiving unit 21 has succeeded in receiving $(1+\epsilon)K$ elements (check nodes) of the code word vector, and the code word vector is given by $c' \in F_2^{(1+\tau)K}$.

The decoding unit 22 reconstructs the elements of the information sequence while referring to the index calculation table stored in the index calculation table storage part 23. Next, the configuration of the index calculation table will be explained.

For example, in a case in which the check matrix H is formed using the matrix (1) shown in Equation 1, if rows with a row weight 1 starts from s1=1, rows with a row weight 2 starts from s2, and rows with a row weight 3 starts from s3, . . . , for nonnegative integers i, a, b and c, a polynomial representation of the submatrix with the row weight 1 is given by $y_{s1+i} = y_{1+i} = g^i$, a polynomial representation of the submatrix with the row weight 2 is given by $y_{s2+i} = g^i + g^{(a+i)}$, and a polynomial representation of the submatrix with the row weight 3 is given by $y_{s3+i} = g^i + g^{(b+i)} + g^{(c+i)}$ where $g^i$ corresponds to the ith element of the information sequence.

Assuming b=2a, the submatrix $y_{s3+i}$ with the row weight 3 is given by $y_{s3+i} = g^i + g^{(2a+i)} + g^{(c+i)}$. Then, when calculating $$y_{s2+i} + y_{s3+a+i} + y_{s3+i}, \, y_{s2+i} + y_{s3+a+i} + y_{s3+i} = $$
$$g^i + g^{(a+i)} + g^{(a+i)} + g^{(2a+i)} + g^i + g^{(2a+i)} + g^{(c+i)} = g^{(c+i)}$$

can be obtained, and then $g^{(c+i)}$ can be derived. This means that $g^{(c+i)}$ can be calculated if the reception of the packets having row numbers which satisfy {s2+i, s3+a+i, s3+i} and $0<=i$ is successful. The index calculation table holds a relation among row numbers which, even if a polynomial corresponding to a lacking row number exists, makes it possible to reconstruct the elements of the specific information sequence only with addition of a polynomial corresponding to another row number.

The provision of such a table makes it possible, even if a lacking row number exists, to easily reconstruct the elements of the specific information sequence. Furthermore, because each polynomial has a cyclic construction, if the cycle of the cyclic construction is q, the q cycles of calculations can be carried out using the same algorithm.

Figure 4:
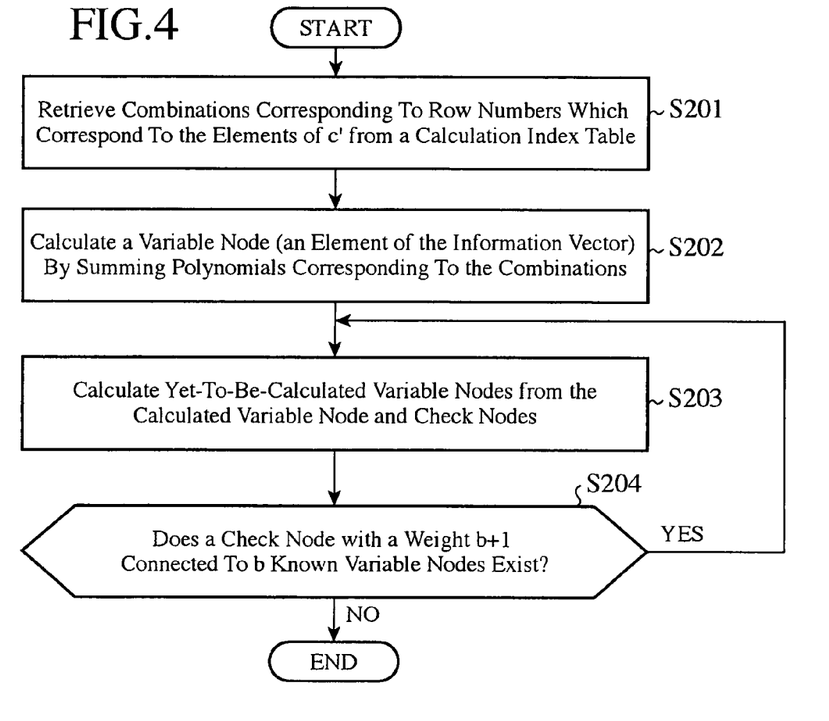
FIG. 4 is a flow chart of a decoding process in accordance with embodiment of the present invention.

Next, the decoding process performed by the decoding unit 22 will be explained. FIG. 4 is a flow chart of the decoding process performed by the decoding unit 22. The decoding unit 22 carries out the decoding process in the same manner that simultaneous equations with two unknowns are solved according to the following procedure, where $i \neq j \neq k \neq l$ is established. For a row number which corresponds to each element of c', the decoding unit searches for a combination which matches with one or more calculation index tables (in step S201).

Next, by using a combination of polynomials which correspond to row numbers (which match with the numbers of check nodes) which match with the one or more calculation index tables, the decoding unit calculates a check node $c_i$ with a weight 1 by adding the polynomials, and determines the value of a variable node $x_j$ linked to the check node $c_i$ from $x_j = c_i$ (in step S202). The decoding unit then adds the value to a check node $c_k$ with a weight (b+1) linked to variable nodes which are already known (the number of the variable nodes is b), as shown in equation (4), so as to determine an unknown variable node $x_1$ (in step S203).

[Equation 2]

$$x_j = \Sigma x_j + c_k \bmod 2 \qquad (4)$$

$\Sigma x_j(s)$ is the addition of the values of all of the b variable nodes which are already known and which are linked to the check node $c_k$.

Next, if a check node with a weight b+1 linked to the b variable nodes which are already known exists (in step S204: Yes), the decoding unit returns to step S203. Otherwise, the decoding unit ends the process.

Thus, the provision of an index calculation table makes it possible to reconstruct the elements of a specific information sequence very easily.

Although the above explanation is directed to the coding processing and decoding processing in accordance with this embodiment of the present invention, the method of forming a check matrix for use in this embodiment of the present invention will be explained hereafter. First, a method of deriving a weight distribution which defines the configuration condition 1 which the check matrix must satisfy will be explained. Next, a method of arranging elements having a value of 1 along a direction of the columns of the check matrix H as uniformly as possible in the check matrix, so that the check matrix satisfies the configuration condition 2, will be explained.

[The Method of Deriving the Weight Distribution D]

The weight distribution D is dependent on the decoding method. In accordance with this embodiment of the present invention, the decoding method is based on a Gaussian elimination algorithm, as will be mentioned later. Because a column which does not have 1 exists in the reconfigured check matrix, when the rank of the reconfigured check matrix becomes less than K, the received packet sequence cannot be decoded according to the Gaussian elimination algorithm. In the Gaussian elimination algorithm, the operation time becomes large with increase in the number of 1s included in the check matrix.

In order to solve this problem, 1 has to exist in all the columns with a predetermined probability or more. Then, in order to achieve this objective with a small total weight, it is desirable to reduce the average of the column weights and to reduce the probability that the number of "1s" which exist in each column is "0."

In order to reduce the probability that a column which does not have 1 exists in the reconfigured check matrix, instead of the method of forming the check matrix at random as before, a method of restricting the formation of the check matrix so that each of all the column weights of the check matrix is sufficiently large is used. A probability g(x) that a column with a weight x exists in a matrix which is obtained by extracting N' (N' is a natural number equal to or less than N) rows from the check matrix with a code word vector length N, an information vector length K, and a column weight $\lambda$ at random is calculated according to the following equation (5):

[Equation 3]

$$g(x) = \frac{_{N'}C_x \cdot \lambda!}{(\lambda - x)!} \cdot \frac{(N - \lambda)!}{N!} \cdot \frac{(N - \lambda)!}{(N - N' - \lambda + x)!} \qquad (5)$$

Figure 5:
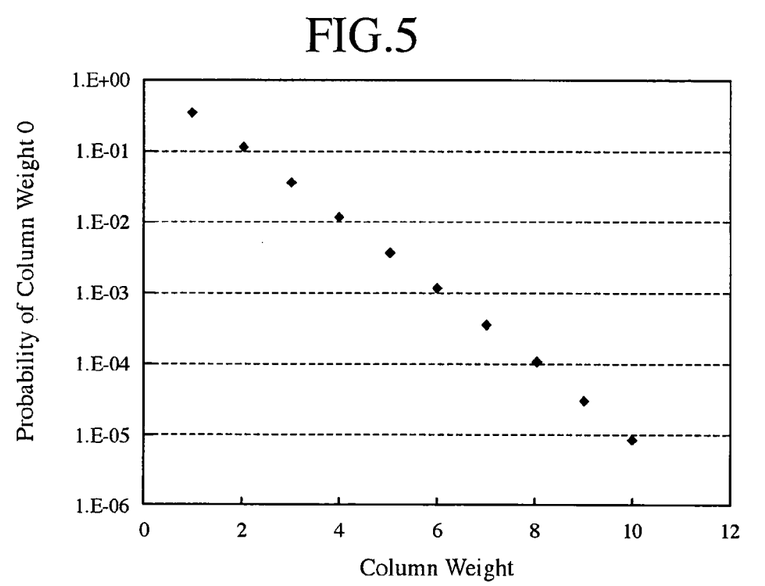
FIG. 5 is a diagram showing a probability distribution in which a column with column weight 0 appears in a matrix with predetermined column weight.

The probability that a column which does not have 1 exists in the reconfigured check matrix is calculated from the equation (5) for each column weight $\lambda$, and a relation between the calculated probability and $\lambda$ is as illustrated in FIG. 5. In this figure, N=150 and N'=100. It can be seen from this figure that when the column weight is made to become equal to or larger than 4, the probability that a column which does not have 1 exists in the reconfigured check matrix is reduced to about 1% or less.

Figure 6:
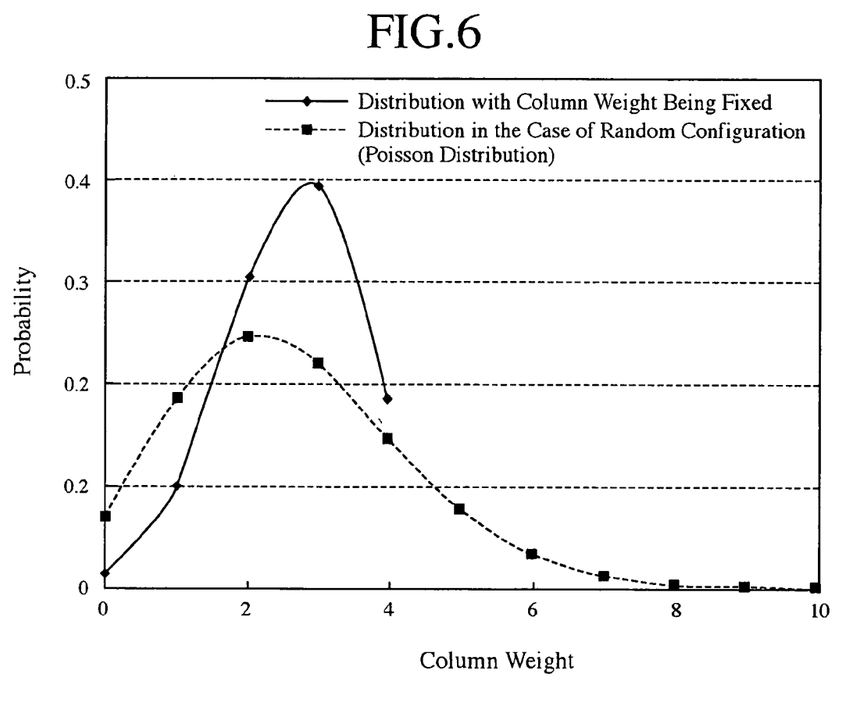
FIG. 6 is a diagram showing a probability distribution and a Poisson distribution in a case of fixed column weight.

The column weight distribution of a check matrix which is reconfigured from a check matrix (N×N') with a column weight 4 by extracting N' rows from the check matrix (N×N') is shown in FIG. 6. In this figure, N=150 and N'=100. For purposes of comparison, the figure also shows a distribution of the column weight of a check matrix which is reconfigured by extracting N' rows from a check matrix with the same column weight $\lambda$=4, which is formed at random, like an LT code. The column weight distribution in the case of forming the code at random is a Poisson distribution with an average $\lambda \times N'/N$, and the probability f(x) that a column with the weight x exists is calculated according to the following equation (6):

[Equation 4]

$$f(x) = \frac{e^{-\lambda} \lambda^x}{x!} \qquad (6)$$

It can be seen from the comparison in FIG. 6 of the case in which the check matrix is formed at random and the case in which the check matrix is formed with the column weight being fixed, even if they have the same column weight, the latter case has a lower probability that a column which does not have 1 exists, and is therefore advantageous for the decoding according to the Gaussian elimination algorithm.

When a weight having the largest existence probability is expressed as $x_{max}$, a feature in a case in which the column weight is fixed is that the existence probability has a high rate of increase when it rises from the weight 0 to the weight $x_{max}$, whereas it has a low rate of decrease after it decreases from $x_{max}$. Therefore, as compared with a case in which the check matrix is formed at random, $x_{max}$ can be reduced to a lower value and the existence probability of the weight 0 can be reduced. The property of being able to reduce the existence probability of the weight 0 results in solving the problem of case 1. The property of being able to reduce $x_{max}$ to a lower value offers an advantage of reducing the amount of computations. This is because reduction in the column weight leads to reduction in the number of times that an addition of rows is performed at the time of using the Gaussian elimination algorithm.

In arithmetic operations according to the Gaussian elimination algorithm, it is preferable that a column on which an arithmetic operation will be performed at a later time has a larger column weight. This is because an addition of columns which have 1 in the same row results in even a column in which 1 exists having no is as its diagonal elements, and therefore the Gaussian elimination algorithm mends in failure. Therefore, the column weight is so formed nonuniformly that it decreases along a direction opposite to the direction in which the Gaussian elimination algorithm is carried out.

Thus, it is advantageous to derive the weight distribution according to the probability distribution in which the column weight is fixed nonuniformly. Therefore, in accordance with this embodiment of the present invention, the weight distribution D is derived according to the above-mentioned probability distribution, and the check matrix is formed on the basis of the weight distribution D. Next, the method of deriving the weight distribution will be explained concretely.

First, a maximum probability P0 of the existence probability of the column weight 0 is set up. Next, a maximum of the total sum of the column weights of the columns of the check matrix is determined. In order to define the total sum of the column weights of the columns of the check matrix in the case in which the check matrix is formed at random as the maximum, and to set the probability that the column weight is 0 to P0, the maximum of the total sum of the columns of the column weights $N'\times\lambda=-N'\times\log P0$ is calculated because $f(0)=e^{-\lambda}=P0$. The minimum of the column weights is chosen so that the existence probability of the column weight 0 becomes equal to or less than P0, and the check matrix is so formed that the column weights have a biased distribution and therefore the total sum becomes equal to or less than $-N'\times\log P0$. The column weights are so determined that it decreases linearly along a direction opposite to the direction in which the Gaussian elimination algorithm is carried out.

According to the above-mentioned procedure, by inputting only the maximum P0 of the existence probability of the column weight, the number of rows with each weight can be calculated by using a computer. As an alternative, the weight distribution can be calculated by means of this method at the time of the design of the system, and the check matrix can be formed according to the calculated weight distribution.

In the procedure previously explained, the nonuniform column weights are calculated by using a linear equation. As an alternative, the check matrix can be formed by calculating the nonuniform column weights by using a nonlinear equation, such as a quadratic curve.

[The Method of Forming the Check Matrix]

Next, the method of forming the check matrix H will be explained. The configuration condition 1 set on the check matrix H can be satisfied by arranging a number of rows in each of which the same number of cyclic-permutation matrices as the row weight are arranged, the number of rows satisfying the weight distribution D, and then gradually increasing or decreasing the row weight, e.g., by arranging rows with the weight 1 according to the weight distribution D first, arranging rows with the weight 2 according to the weight distribution D, and then . . . .

As previously mentioned, what is necessary is to store only a polynomial or some elements of the check matrix by forming the check matrix so that the row weight gradually increases or decreases, and the amount of arithmetic operations hardly increases also when developing elements of the check matrix, which have not been stored, at the time of the coding.

Next, the polynomial $y_n$ (i.e., the polynomial indicating the nth row of the check matrix H) which satisfies the configuration conditions 2 is set up as follows. When the information length (the total degree of the check matrix H) is expressed as K, the number of rows with a row weight w which satisfies the weight distribution D in the check matrix H is expressed as R(w), and the starting row of a submatrix with the row weight w in the check matrix H is expressed as s(w), the location of each row of the submatrix with the row weight w is given by s(w)+i, i=0, 1, . . . , R(w)−1. As a result, the polynomial is given by $y_{s(w)+i}$.

First, a term with a degree i and a term with a degree K−R(w)+1+i are disposed in the polynomial $y_i$. That is, the polynomial $y_{s(w)+i,j}$ is given by:

$$y_{s(w)+i}=g^i+\ldots+g^{(K-R(w)+1+i)}, i=0, 1, \ldots, R(w)-1$$

where the degree i is referred to as a minimum degree and the degree K−R(w)+1+i is referred to as a maximum degree.

Furthermore, when w exceeds 2, the degree of (w−2) terms (the degree of these terms is called a medium degree) is determined so that it becomes equal to a value intermediate between the minimum degree and the maximum degree, and the terms of the selected degree are further disposed in the polynomial. For example, when the row weight w=3, the information length K=100, and R(3)=5 (this means that five rows with the row weight 3 exist), the minimum degree is i and the maximum degree is K−R(w)+1+i=100−5+1+i=96+i. Then, w−2=3−2=1, and, as the medium degree, 48+i which is intermediate between i and 96+i is selected. Therefore, in the case of w=3, the polynomial $y_{s(3)+i}$ is given by:

$$y_{s(3)+i}=g^i+\ldots+g^{47+i}=g^i+g^{48+i}+g^{96+i}, i=0, 1, \ldots, 4$$

In this way, the distribution of is in the check matrix H can be so formed that is are arranged as uniformly as possible.

As mentioned above, the coding apparatus in accordance with this embodiment of the present invention forms a low-density parity-check matrix which satisfies a predetermined weight distribution by continuously arranging a number of rows in each of which the same number of cyclic-permutation matrices as the row weight are arranged, the number of rows satisfying the predetermined weight distribution, and then gradually increasing or decreasing the row weight, and then uses the low-density parity-check matrix so as to generate a low-density parity-check code. Therefore, the present embodiment offers an advantage of being able to improve the performance of the coding apparatus as compared with a prior art method using a random number sequence.

INDUSTRIAL APPLICABILITY

The present invention can be widely applied to a communications system using a disappearance correction error code, equipment which carries out a signal transmission, etc.

The invention claimed is:

1. An error correction coding apparatus which generates a low-density parity-check code from an input information sequence by using a low-density parity-check matrix which satisfies a predetermined weight distribution, said error correction coding apparatus comprising:
   a low-density parity-check matrix storage unit for storing information used for forming said low-density parity-check matrix; and
   a coding unit for encoding said input information sequence according to the low-density parity-check matrix,
   wherein said low-density parity-check matrix comprises at least a first set of adjacent rows corresponding to a first row weight, and a second set of adjacent rows corresponding to a second row weight, said first set of adjacent rows being adjacent to said second set of adjacent rows in said low-density parity-check matrix,
   wherein each of the rows of said first set of adjacent rows contains a same number of cyclic-permutation matrices corresponding to said first row weight, wherein each of the rows of said second set of adjacent contains a same number of cyclic-permutation matrices corresponding to said second row weight, wherein the number of rows of said first set of adjacent rows and the number of rows of said second set of adjacent rows satisfy said predetermined weight distribution, and wherein said number of cyclic-permutation matrices corresponding to said second row weight is determined by increasing or decreasing said number of cyclic-permutation matrices corresponding to said first row weight by one.

2. The error correction coding apparatus according to claim 1, said low-density parity-check matrix storage unit stores the respective first rows of said first and second sets of adjacent rows in said low-density parity-check matrix in advance of encoding said input information sequence, and outputs said stored rows to said coding unit, and wherein said coding unit reconstructs the rows of said first and second sets of adjacent rows other than said stored rows outputted from said low-density parity-check matrix storage unit by carrying out cyclic shifts of said stored rows outputted from said low-density parity-check matrix storage unit, and for generating the low-density parity-check code from the input information sequence by using the reconstructed rows and the stored rows outputted from said low-density parity-check matrix storage unit.

3. The error correction coding apparatus according to claim 1, wherein said low-density parity-check matrix storage unit uses, as said predetermined weight distribution, a weight distribution according to a Poisson distribution.

4. The error correction coding apparatus according to claim 1, wherein a number of rows of a submatrix which consists of rows of a weight w (w is a natural number equal to or larger 3) is expressed as R(w), an information length is expressed as K (K is a natural number), and a row position in said submatrix is expressed as i ($0<=i<=R(w)-1$), and wherein the low-density parity-check matrix storage unit sets elements at an ith column and a (K−R(w)+1+i)th column of a row at the row position i of said submatrix to 1, arranges cyclic-permutation matrices in said submatrix so that (w−2) 1s are distributed at almost equal intervals between the ith column and the (K−R(w)+1+i)th column, and outputs said submatrix to said coding unit.

\* \* \* \* \*